(12) United States Patent
Zhao et al.

(10) Patent No.: US 12,211,555 B2
(45) Date of Patent: Jan. 28, 2025

(54) MEMORY DEVICE, MEMORY SYSTEM, AND PROGRAM METHOD THEREOF

(71) Applicant: Yangtze Memory Technologies Co., Ltd., Hubei (CN)

(72) Inventors: XiangNan Zhao, Hubei (CN); HongTao Liu, Hubei (CN); Chenhui Li, Hubei (CN)

(73) Assignee: YANGTZE MEMORY TECHNOLOGIES CO., LTD., Hubei (CN)

( * ) Notice: Subject to any disclaimer, the term of this patent is extended or adjusted under 35 U.S.C. 154(b) by 173 days.

(21) Appl. No.: 18/090,307

(22) Filed: Dec. 28, 2022

(65) Prior Publication Data
US 2024/0185925 A1 Jun. 6, 2024

(30) Foreign Application Priority Data
Dec. 6, 2022 (CN) .......................... 202211557489.3

(51) Int. Cl.
*G11C 16/14* (2006.01)
*G11C 16/08* (2006.01)
*G11C 16/10* (2006.01)
*G11C 16/12* (2006.01)

(52) U.S. Cl.
CPC ............ *G11C 16/102* (2013.01); *G11C 16/08* (2013.01); *G11C 16/12* (2013.01)

(58) Field of Classification Search
CPC ...................................... G11C 16/14
See application file for complete search history.

(56) References Cited

U.S. PATENT DOCUMENTS

2019/0066797 A1* 2/2019 Yip ........................ G11C 16/14

\* cited by examiner

*Primary Examiner* — Jason Lappas
(74) *Attorney, Agent, or Firm* — Conley Rose, P.C.

(57) ABSTRACT

Disclosure includes systems, methods and devices to program a memory device, involving a first and a second programming operations on a memory cell of the memory device. In the first programming operation, the memory cell is programmed into an intermediate state. In the second programming operation, the memory cell is programmed from the intermediate state into a target state. The first programming operation includes providing a bias voltage to a bit line coupled to the memory cell and providing a programming voltage to a word line coupled to the memory cell. An amplitude of the bias voltage provided to the bit line depends on the intermediate state or the target state the memory cell to be programmed into. Accordingly, no verification operation need to be performed on the memory cell in the first programming operation.

20 Claims, 12 Drawing Sheets

MEMORY DEVICE, MEMORY SYSTEM, AND PROGRAM METHOD THEREOF

CROSS-REFERENCE TO RELATED APPLICATIONS

The present application claims priority to Chinese Patent Application No. 202211557489.3, which was filed Dec. 6, 2022, and is hereby incorporated herein by reference in its entirety.

TECHNICAL FIELD

The present disclosure generally relates to the field of semiconductor technology, and more particularly, to memory device, memory system, and program method thereof.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND flash memory, many layers of memory cells can be stacked vertically such that storage density per unit area can be greatly increased. The vertically stacked memory cells can form memory strings, where the channels of the memory cells are connected in each memory string. Each memory cell can be addressed through a word line and a bit line. Data (i.e., logic states) of memory cells coupled to a same word line can be read or programmed simultaneously. However, fabrication of many layers of memory cells is limited by etching techniques, and aggressive scaling of the storage density per unit area requires reducing the distance between adjacent layers of memory cells, and issues such as initial threshold voltage shift and word line interference become more and more significant in affecting the reliability of programming the memory cells.

BRIEF SUMMARY

Embodiments of systems, methods and devices for programming a memory device are described in the present disclosure.

In some embodiments, a method can include programming a memory cell in a memory device in a two-step scheme, including a first programming operation and a second programming operation. In the first programming operation, the memory cell is programmed from the erased state into an intermediate state. In the second programming operation after the first programming operation, the memory cell is programmed from the intermediate state into a target state according to the data to be stored.

In some embodiments, the first programming operation is includes providing a programming voltage signal to a word line coupled to the memory cell while providing a bias voltage on a bit line coupled to the memory cell.

In some embodiments, an amplitude of the bias voltage provided to the bit line is configured in accordance with the target state. In some embodiments, if the target state corresponds to a larger threshold voltage of the memory cell, the amplitude of the bias voltage provided to the bit line is lower.

In some embodiments, the amplitude of the bias voltage applied on the bit line is configured in accordance with the intermediate state. In some embodiments, if the intermediate state corresponds to a larger threshold voltage of the memory cell, the amplitude of the bias voltage provided to the bit line is lower.

In some embodiments, during the first programming operation, the programming voltage signal provided to the word line of the memory cell comprises a single voltage pulse.

In some embodiments, after performing the first programming operation to program the memory cell into the intermediate state and before performing the second programming operation, verification operation can be omitted.

In some embodiments, the second programming operation is performed using an incremental step pulse programming (ISPP) scheme.

In some embodiments, the two-step programming method can be implemented on first and second memory cells coupled to a same bit line and two adjacent word lines, wherein four programming operations are involved, by combining the first and second programming operations of each of the first and second memory cells. In the first programming operation, the first memory cell is programmed into a first intermediate state. In the second programming operation, the second memory cell is programmed into a second intermediate state. After the first and second memory cells are programmed into the first and second intermediate states, in the third and fourth programming operations, the first and second memory cells are programmed into first and second target states.

In some embodiments, an intermediate state can be one of a plurality of intermediate states, and a target state can be one of a plurality of target states. Each intermediate state corresponds to one or more target states.

In some embodiments, providing a bias voltage to the bit line includes providing a bias voltage with an amplitude according to the target state. The higher a threshold voltage of the memory cell in the target state, the lower the amplitude.

In some embodiments, providing a bias voltage to the bit line includes providing a bias voltage with an amplitude according to the intermediate state. The higher a threshold voltage of the memory cell in the intermediate state, the lower the amplitude.

In some embodiments, a quantity of the plurality of intermediate states is two, another quantity of the plurality of target states is eight. Each intermediate state corresponds to four target states.

In some embodiments, a quantity of the plurality of intermediate states is four, another quantity of the plurality of target states is eight. Each intermediate state corresponds to two target states.

In some embodiments, a quantity of the plurality of intermediate states is four, another quantity of the plurality of target states is sixteen. Each intermediate state corresponds to four target states.

Embodiments of a memory devices implementing the aforementioned programming methods are also described in the present disclosure.

In some embodiments, a memory device can include a memory array and a peripheral circuit. The memory array can include a plurality of memory cells, a plurality of bit lines, and a plurality of word lines. Each memory cell is coupled to a bit line of the plurality of bit lines and a word line of the plurality of word lines. The peripheral circuit can include a word line driver coupled to the plurality of word lines of the memory array, and a bit line driver coupled to a plurality of bit lines of the memory array. The peripheral circuit can be configured to perform a first programming operation to program a memory cell into an intermediate state and perform a second programming operation to program the memory cell from the intermediate state into a target state. The first programming operation includes providing a bias voltage to a bit line coupled to the memory cell by the bit line driver and providing a programming voltage to a word line coupled to the memory cell by the word line driver.

In some embodiments, the programming voltage provided to the word line can include a single voltage pulse.

In some embodiments, the peripheral circuit is configured not to perform a verification operation on the memory cell, after providing the programming voltage to the word line, and before performing the second programming operation.

In some embodiments, the intermediate state can be one of a plurality of intermediate states, and the target state can be one of a plurality of target states. Each intermediate state corresponds to one or more target states.

In some embodiments, the peripheral circuit is configured to provide a bias voltage with an amplitude according to the target state. The higher a threshold voltage of the memory cell in the target state, the lower the amplitude.

In some embodiments, the peripheral circuit is configured to provide a bias voltage with an amplitude according to the intermediate state. The higher a threshold voltage of the memory cell in the intermediate state, the lower the amplitude.

Embodiments of a memory system implementing the aforementioned programming methods are also described in the present disclosure.

In some embodiments, a memory system can include a memory controller and a memory device coupled to the memory controller. The memory controller can be configured to provide programming commands. The memory device can be configured to receive the programming commands. The memory device can include a memory array and a peripheral circuit. The memory array can include a plurality of memory cells, a plurality of bit lines, and a plurality of word lines. Each memory cell is coupled to a bit line of the plurality of bit lines and a word line of the plurality of word lines. The peripheral circuit can include a word line driver coupled to the plurality of word lines of the memory array, a bit line driver coupled to a plurality of bit lines of the memory array. The peripheral circuit can be configured to perform a first programming operation to program a memory cell into an intermediate state and perform a second programming operation to program the memory cell from the intermediate state into a target state. The first programming operation includes providing a bias voltage to a bit line coupled to the memory cell by the bit line driver and providing a programming voltage to a word line coupled to the memory cell by the word line driver.

In some embodiments, the programming voltage provided to the word line can include a single voltage pulse.

In some embodiments, the peripheral circuit is configured not to perform a verification operation on the memory cell, after providing the programming voltage to the word line, and before performing the second programming operation.

In some embodiments, the intermediate state can be one of a plurality of intermediate states, and the target state can be one of a plurality of target states. Each intermediate state corresponds to one or more target states Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
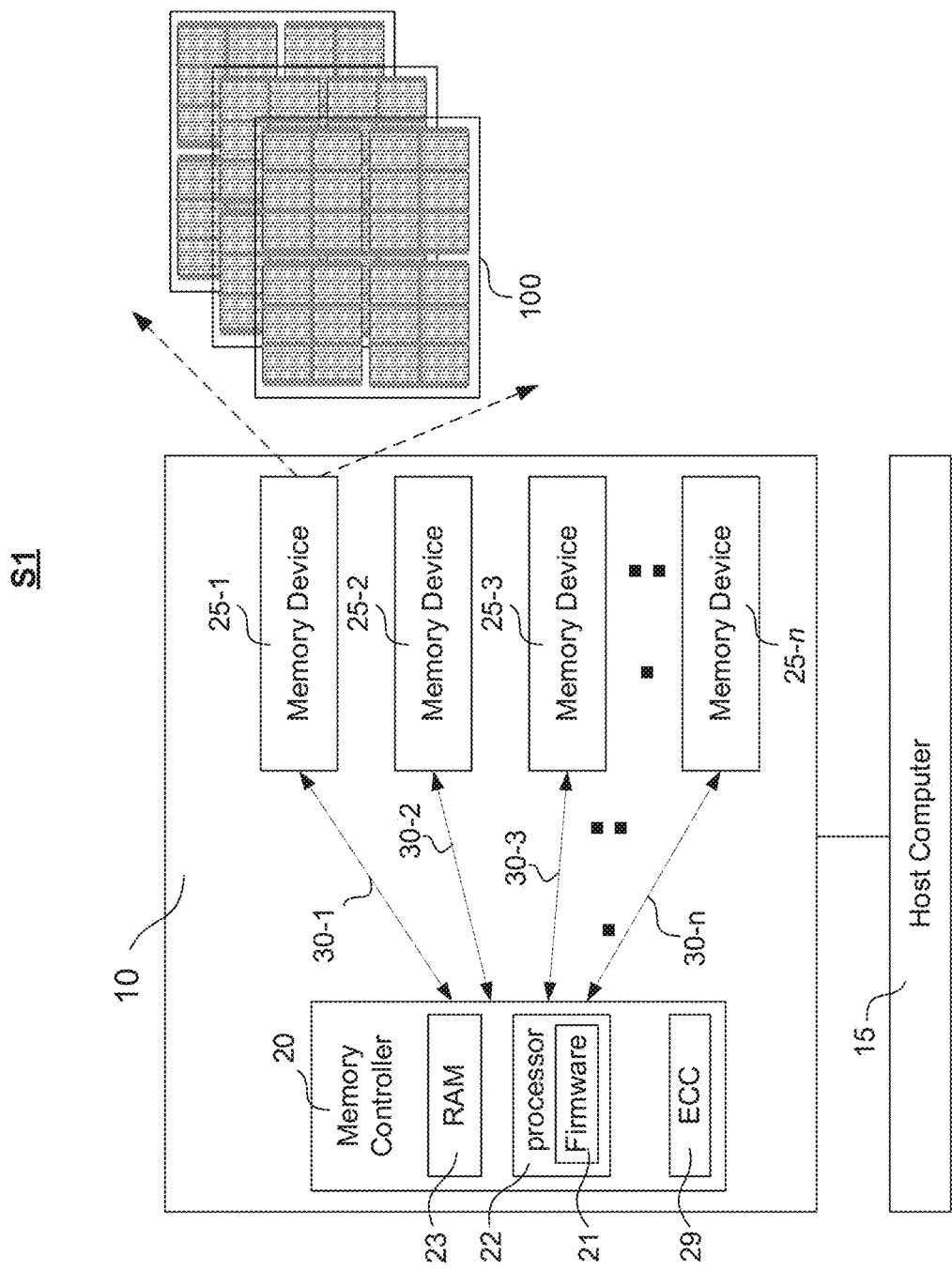
FIGS. 1 and 2A-2B illustrate a storage system with one or more memory devices, according to some embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure, or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures, or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and can, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the terms "about" or "approximately" indicate the value of a given quantity that can vary based on a particular technology node associated with the subject semiconductor device. Based on the particular technology node, the terms "about" or "approximately" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 illustrates a block diagram of a system S1 having a storage system 10, according to some embodiments. In some embodiments, system S1 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. Storage system 10 (e.g., a NAND storage system) can include a memory controller 20 and one or more semiconductor memory chips 25-1, 25-2, 25-3, . . . , 25-n. Each semiconductor memory device 25 (hereafter just "memory device") can be a NAND chip (e.g., "flash," "NAND flash" or "NAND"). Storage system 10 can communicate with a host 15 through memory controller 20, where memory controller 20 can be connected to one or more memory devices 25-1, 25-2, 25-3, . . . , 25-n, via one or more memory channels 30-1, 30-2, 30-3, . . . , 30-n. In some embodiments, each memory device 25 can be managed by memory controller 20 via one or more memory channels 30-1, 30-2, 30-3, . . . , 30-n.

In some embodiments, host 15 can include a processor of an electronic device, such as a central processing unit (CPU), or a system-on-chip (SoC), such as an application processor (AP). Host 15 can send data to be stored at storage system 10 and/or can retrieve data from stored in storage system 10.

In some embodiments, memory controller 20 can handle I/O requests received from host 15, ensure data integrity and efficient storage, and manage memory device 25. To perform these tasks, memory controller 20 can run firmware 21, which can be executed by one or more processors 22 (e.g., micro-controller units, CPU) of memory controller 20. For example, memory controller 20 can run firmware 21 to map logical addresses (e.g., address utilized by the host associated with host data) to physical addresses in memory device 25 (e.g., actual locations where the data is stored). Memory controller 20 also runs firmware 21 to manage defective memory blocks in the memory device 25, where the firmware 21 can remap the logical address to a different physical address, i.e., move the data to a different physical address. Memory controller 20 can also include one or more memories 23 (e.g., DRAM, SRAM, EPROM, etc.), which can be used to store various metadata used by the firmware 21. In some embodiments, memory controller 20 can also perform error recovery through an error correction code (ECC) engine 29. ECC is used to detect and correct the raw bit errors that occur within each memory device 25.

In some embodiments, memory channels 30 can provide data and control communication between memory controller 20 and each memory device 25 via a data bus. Memory controller 20 can select one of memory devices 25 according to an enable signal.

In some embodiments, each memory device 25 in FIG. 1 can include one or more memory dies 100, where each memory die can be a 3D NAND memory.

Figure 2A:
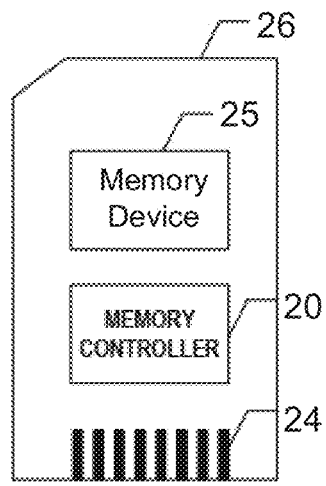
Figure 2B:
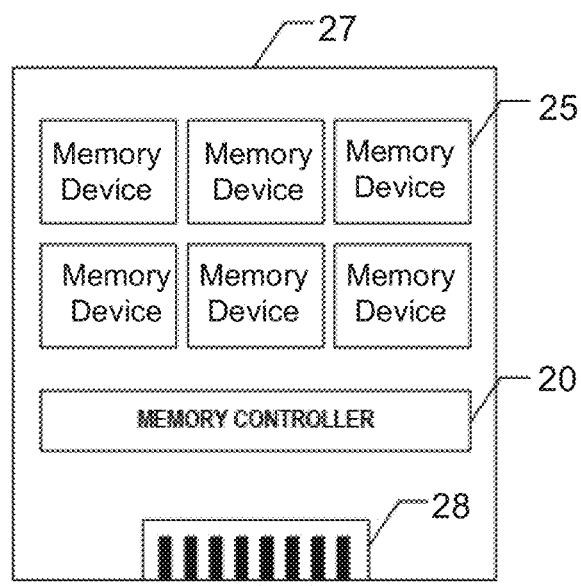

In some embodiments, memory controller 20 and one or more memory device 25 can be integrated into various types of storage devices, for example, be included in the same package, such as a universal Flash storage (UFS) package or an eMMC package. That is, storage system 10 can be implemented and packaged into different types of end electronic products. In one example as shown in FIG. 2A, memory controller 20 and a single memory device 25 can be integrated into a memory card 26. Memory card 26 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 26 can further include a memory card connector 24 coupling memory card 26 with a host (e.g., host 15 in FIG. 1). In another example as shown in FIG. 2B, memory controller 20 and multiple memory devices 25 can be integrated into a solid state drive (SSD) 27. SSD 27 can further include an SSD connector 28 coupling SSD 27 with a host (e.g., host 15 in FIG. 1).

Figure 3:
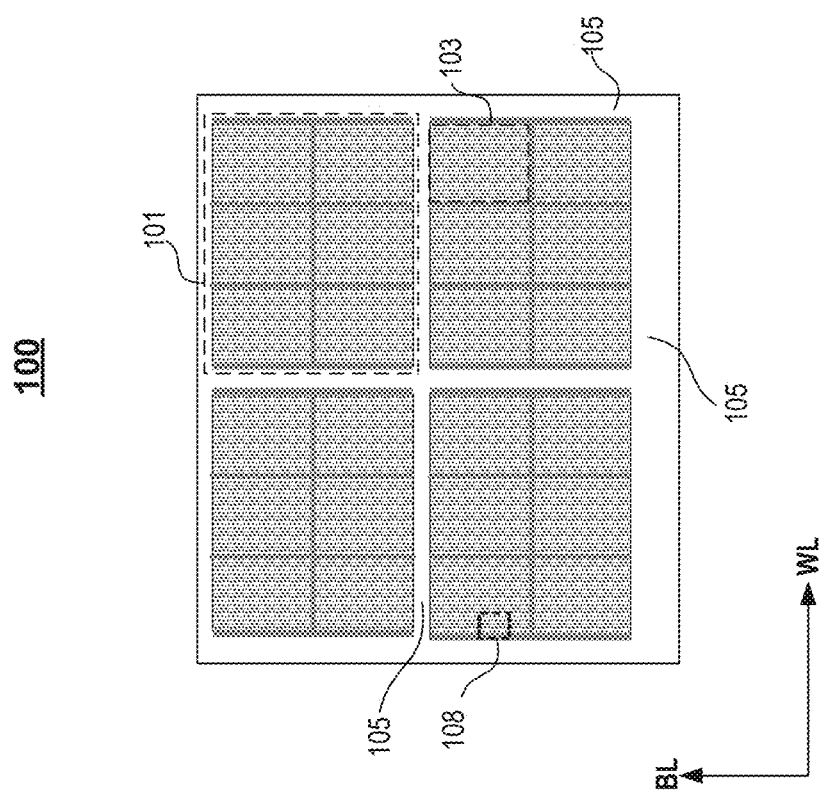
FIG. 3 illustrates a schematic diagram of a memory die, according to some embodiments.

FIG. 3 illustrates a top-down view of a memory die 100, according to some embodiments. The example configuration shown in FIG. 3 is given as a non-limiting example and it is to be appreciated that memory is scalable. In some embodiments, memory die 100 can include one or more memory arrays 101, each of which can include a plurality of memory blocks 103. Identical and concurrent operations can take place at each memory arrays 101. Memory block 103, which can be megabytes (MB) in size, is the smallest size to carry out erase operations. Memory die 100 can include, for example, four memory arrays 101. Each memory array 101 can include, for example, six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 3.

In some embodiments, memory die 100 can also include a periphery region 105, an area surrounding memory arrays 101. The periphery region 105 can include many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

In some embodiments, the arrangement of the memory arrays 101 in the memory die 100 and the arrangement of the memory blocks 103 in each memory arrays 101 illustrated in FIG. 3 are only used as an example, which does not limit the scope of the present disclosure.

Figure 4:
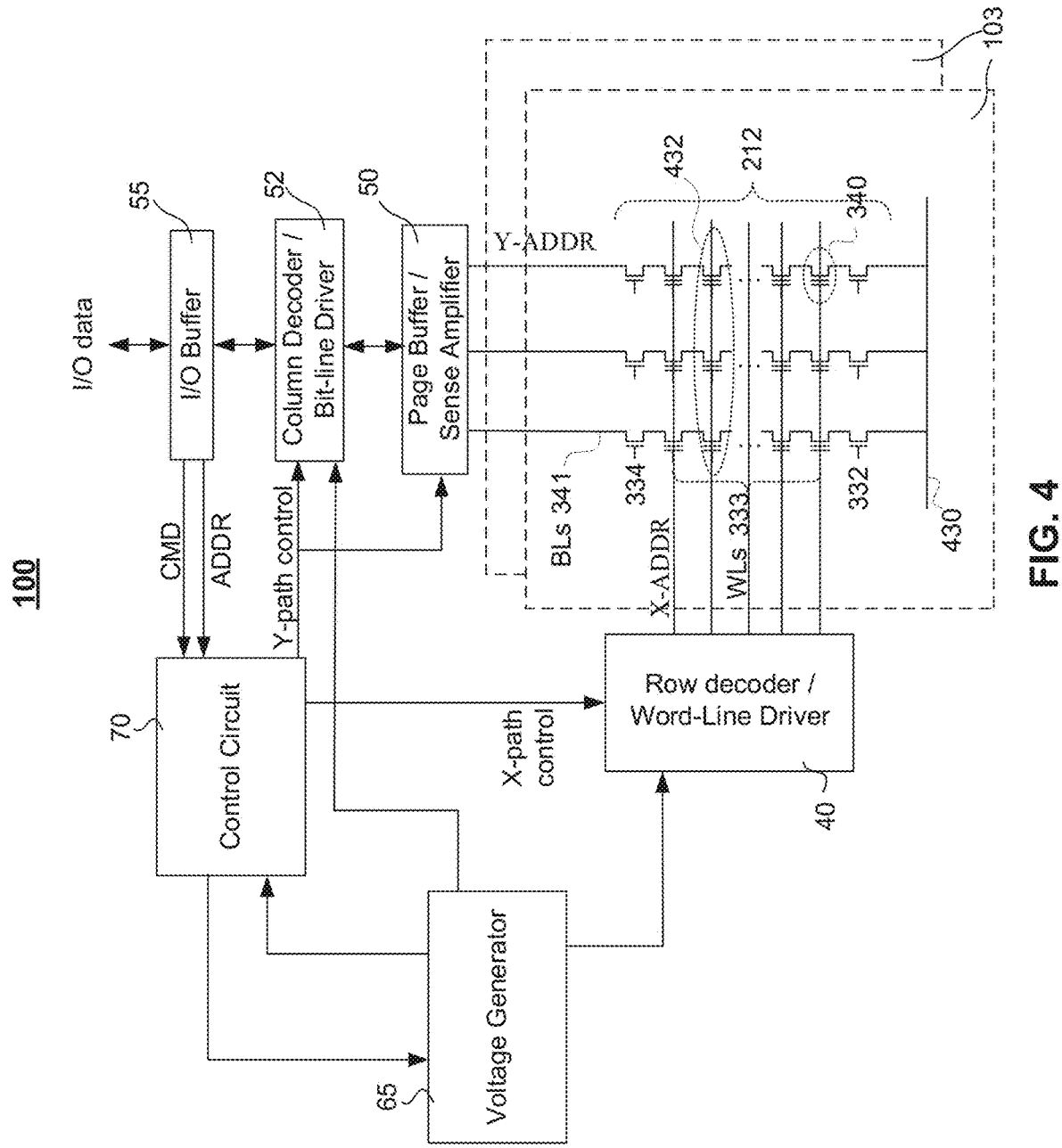
FIG. 4 illustrates a schematic of a three-dimensional (3D) memory die, according to some embodiments.

FIG. 4 illustrates a schematic diagram of the memory die 100, according to some embodiments. In some embodiments, memory die 100 can include one or more memory blocks 103 (e.g., 103-1, 103-2, 103-3). Each memory block 103 can include a plurality of memory strings 212. Each memory string 212 includes a plurality of memory cells 340. Memory cells 340 coupled to a same word line forms a memory page 432. Memory string 212 can also include at least one field effect transistor (e.g., MOSFET) at each end, which is controlled by a lower select gate ("LSG") 332 and a top select gate ("TSG") 334, respectively. Lower select gates ("LSGs") can also be referred to as bottom select gates ("BSGs"). The drain terminal of the top select transistor 334-T can be connected to a bit line 341, and the source terminal of the lower select transistor 332-T can be connected to an array common source ("ACS") 430. ACS 430 can be shared by the memory strings 212 in an entire memory block, and is also referred to as the common source line.

In some embodiments, memory die 100 can also include a periphery circuit that can include many digital, analog, and/or mixed-signal circuits to support functions of the memory block 103, for example, a page buffer/sense amplifier 50, a row decoder/word line driver 40, a column decoder/bit line driver 52, a control circuit 70, a voltage generator 65 and an input/output buffer 55. These circuits can include active and/or passive semiconductor devices, such as transistors, diodes, capacitors, resistors, etc., as would be apparent to a person of ordinary skill in the art.

In some embodiments, memory blocks 103 can be coupled with the row decoder/word line driver 40 via word lines ("WLs") 333, lower select gates ("LSGs") 332 and top select gates ("TSGs") 334. Memory blocks 103 can be coupled with page buffer/sense amplifier 50 via bit lines ("BLs") 341. Row decoder/word line driver 40 can select one of the memory blocks 103 on the memory die 100 in response to an X-path control signal provided by the control circuit 70. Row decoder/word line driver 40 can transfer voltages provided from the voltage generator 65 to the word lines according to the X-path control signal. During the read and program operation, the row decoder/word line driver 40 can transfer a read voltage Vread and a program voltage $V_{pgm}$ to a selected word line and a pass voltage Vpass to an unselected word line according to the X-path control signal received from control circuit 70.

In some embodiments, column decoder/bit line driver 52 can transfer an inhibit voltage $V_{inhibit}$ to an unselected bit line and connect a selected bit line to ground according to a Y-path control signal received from control circuit 70. In the other words, column decoder/bit line driver 52 can be configured to select or unselect one or more memory strings 212 according to the Y-path control signal from control circuit 70. Page buffer/sense amplifier 50 can be configured to read and program (write) data from and to memory block 103 according to the control signal Y-path control from control circuit 70. For example, page buffer/sense amplifier 50 can store one page of data to be programmed into one memory page 432. In another example, page buffer/sense amplifier 50 can perform verify operations to ensure that the data have been properly programmed into each memory cell 340. In yet another example, during a read operation, page buffer/sense amplifier 50 can sense current flowing through bit line 341 that reflects the logic state (i.e., data) of memory cell 340 and amplify small signal to a measurable magnification.

In some embodiments, column decoder/bit line driver 52 can transfer a bias voltage with an amplitude Vbias to a selected bit line according to a Y-path control signal from control circuit 70 and the data to be programmed from page buffer/sense amplifier 50.

In some embodiments, input/output buffer 55 can transfer the I/O data from/to page buffer/sense amplifier 50 as well as addresses ADDR or commands CMD to control circuit 70. In some embodiments, input/output buffer 55 can function as an interface between memory controller 20 (in FIG. 1) and memory die 100 on memory device 25.

In some embodiments, control circuit 70 can control page buffer/sense amplifier 50 and row decoder/word line driver 40 in response to the commands CMD transferred by input/output buffer 55. During the program operation, control circuit 70 can control row decoder/word line driver 40, bit line driver 52, and page buffer/sense amplifier 50 to program a selected memory cell. During the read operation, control circuit 70 can control row decoder/word line driver 40 and page buffer/sense amplifier 50 to read a selected memory cell. The X-path control signal and the Y-path control signal include a row address X-ADDR and a column address Y-ADDR that can be used to locate the selected memory cell in the memory block 103. The row address X-ADDR can include a page index PD, a block index BD and an array index AL to identify memory page 432, memory block 103, and memory array 101 (in FIG. 3), respectively. The column address Y-ADDR can identify a byte or a word in the data of memory page 432.

In some embodiments, voltage generator 65 can generate voltages to be supplied to word lines and bit lines under the control of control circuit 70. The voltages generated by voltage generator 65 include the read voltage Vread, the program voltage $V_{pgm}$, the pass voltage Vpass, the inhibit voltage $V_{inhibit}$, the bit line bias voltage Vbias, etc.

It is noted that the arrangement of the electronic components in the storage system 10 and the memory die 100 in FIGS. 1, 2A-2B, and 3-4 are shown as non-limiting examples. In some embodiments, storage system 10 and memory die 100 can have other layout and can include additional components. Components (e.g., control circuit 70, I/O buffer 55) on memory die 100 shown in FIG. 4 can also be moved off memory die 100, as a stand-alone electric component in the storage system 10. Components (e.g., control circuit 70, I/O buffer 55) on memory die 100 shown in FIG. 4 can also be moved to other components in storage system 10, for example, a portion of control circuit 70 can be combined with memory controller 20 and vice versa.

Figure 5:
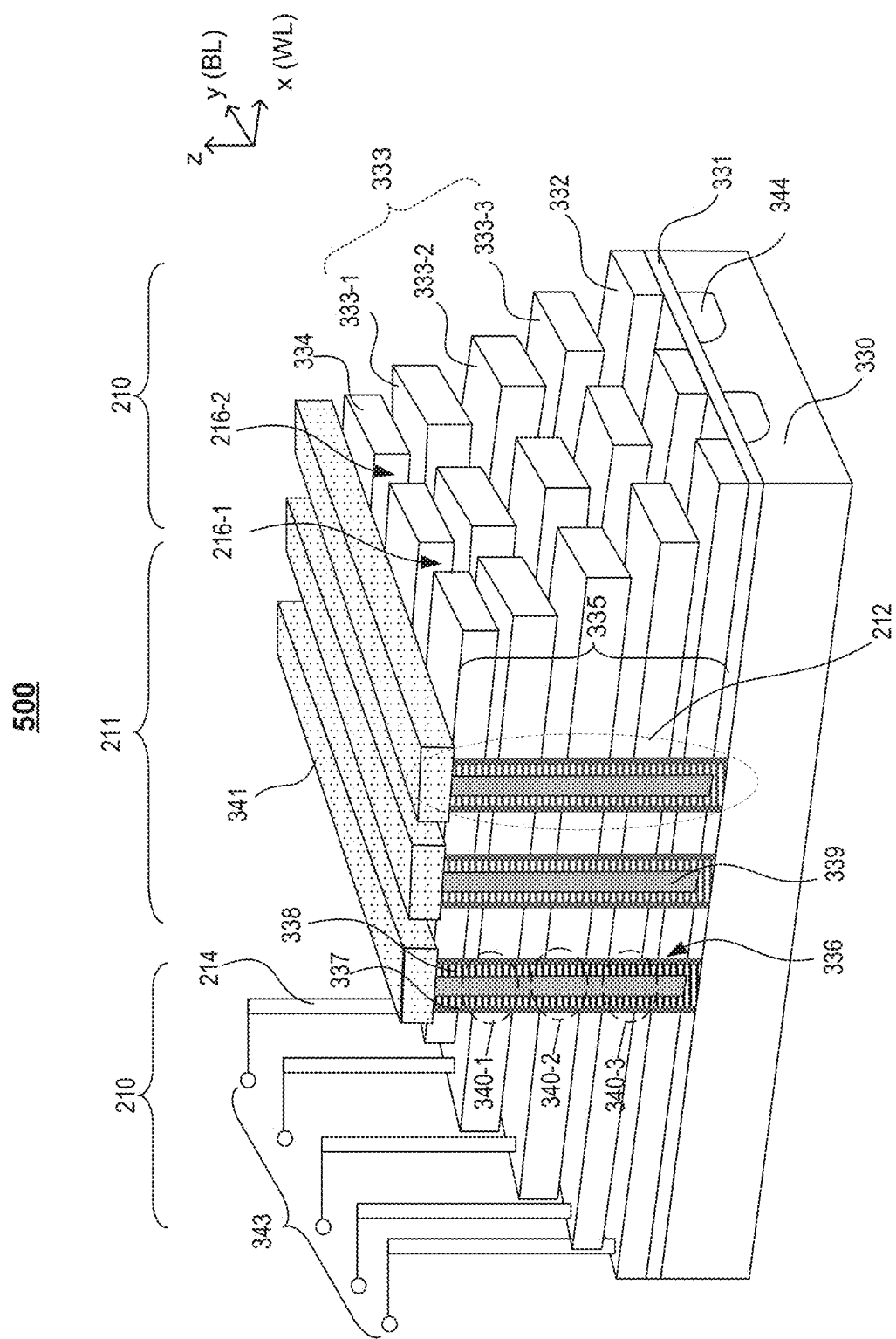
FIG. 5 illustrates a perspective view of a portion of a 3D memory structure, in accordance with some embodiments.

FIG. 5 illustrates a perspective view of a 3D memory structure 500, according to some embodiments. In some embodiments, memory die 100 can be a 3D NAND memory, and 3D memory structure 500 can be a portion of memory die 100, for example, in a region 108 in FIG. 3. 3D memory structure 500 can include a staircase region 210 and a channel structure region 211. Channel structure region 211 can include a plurality of memory strings 212, each including a plurality of stacked memory cells 340. Staircase region 210 can include a staircase structure.

In some embodiments, the 3D memory structure 500 can include a substrate 330, an insulating film 331 over the substrate 330, a tier of lower select gates (LSGs) 332 over the insulating film 331, and a plurality of tiers of control gates 333, also referred to as "word lines," stacking on top of the LSGs 332 to form a film stack 335 of alternating conductive and dielectric layers. The dielectric layers adjacent to the tiers of control gates are not shown in FIG. 5 for clarity.

In some embodiments, the control gates of each tier are separated by slit structures 216-1 and 216-2 through the film stack 335. The 3D memory structure 500 can also include a tier of top select gates (TSGs) 334 over the stack of control gates 333. The stack of TSG 334, control gates 333 and LSG 332 can also be referred to as "gate electrodes." The 3D memory structure 500 can further include doped source line regions 344 in portions of substrate 330 between adjacent LSGs 332. Each of memory strings 212 of the 3D memory structure 500 can include a channel hole 336 extending through the insulating film 331 and the film stack 335 of alternating conductive and dielectric layers. Memory string 212 can also include a memory film 337 on a sidewall of the channel hole 336, a channel layer 338 over memory film 337, and a core filling film 339 surrounded by channel layer 338. Memory cell 340 (e.g., 340-1, 340-2, 340-3) can be formed at the intersection of the control gate 333 (e.g., 333-1, 333-2, 333-3) and memory string 212. A portion of channel layer 338 can respond to the respective control gate and is also referred to as channel 338 of the memory cell. The 3D memory structure 500 further includes a plurality of bit lines (BLs) 341 connected with the memory strings 212 over the TSGs 334. The 3D memory structure 500 can also include a plurality of metal interconnect lines 343 connected with the gate electrodes through a plurality of contact structures 214. The edge of film stack 335 is configured in a shape of staircase to allow an electrical connection to each tier of the gate electrodes.

In FIG. 5, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to control gates 333-1, 333-2 and 333-3, respectively. In some embodiments, the number of control gates and the number of memory cells can be more than three to increase storage capacity. The 3D memory structure 500 can also include other structures, for example, TSG cut, common source contact (i.e., array common source) and dummy memory string. These structures are not shown in FIG. 5 for simplicity. It is noted that the 3D memory structure 500 shown in FIG. 5 is only used as an example, which does not limit the scope of the present disclosure, and any other suitable 3D memory structure can also be adapted. It should be understood that FIG. 5 is for illustrative purposes only. A person skilled in the pertinent art will recognize that other 3D memory structures can be used without departing from the spirit and scope of the present disclosure.

Referring back to FIG. 4, in some embodiments, memory block 103 can be formed based on floating gate technology. In some embodiments, the memory block 103 can be formed based on charge trapping technology. The NAND flash memory based on charge trapping can provide high storage density and high intrinsic reliability. Storage data in the form of logic states ("states," e.g., threshold voltages $V_{th}$ of the memory cell 340) depends on the number of charge carriers trapped in the memory film 337 of the memory cell 340.

In some embodiments, in a NAND flash memory, a read operation and a write operation (also referred to as program operation) can be performed for the memory page 432, and an erase operation can be performed for the memory block 103.

In some embodiments, in a NAND memory, the memory cell 340 can be in an erased state ER or a programmed state P1. Initially, memory cells 340 in memory block 103 can be reset to the erased state ER as logic "1" by implementing a negative voltage difference between control gates 333 and channel 338 such that trapped charge carriers in the memory film of memory cells 340 can be removed. For example, the negative voltage difference can be induced by setting control gates 333 of memory cells 340 to ground, and applying a high positive voltage (an erase voltage $V_{erase}$) to ACS 430. At the erased state ER ("state ER"), the threshold voltage $V_{th}$ of memory cells 340 can be reset to the lowest value.

In some embodiments, during programming (i.e., writing), a positive voltage difference between control gates 333 and channel 338 can be established by, for example, applying a program voltage $V_{pgm}$ (e.g., a positive voltage pulse between 10 V and 20 V) on control gate 333, and grounding the corresponding bit line 341. As a result, charge carriers (e.g., electrons) can be injected into the memory film of memory cell 340, thereby increasing the threshold voltage $V_{th}$ of memory cell 340. Accordingly, memory cell 340 can be programmed to the programmed state P1 ("state P1" or logic "0"). In some embodiments, the state of the memory cell (e.g., state ER or state P1) can be determined by measuring or sensing the threshold voltage $V_{th}$ of the memory cell. During a read operation, a read voltage Vread can be applied on control gate 333 of the memory cell and current flowing through the memory cell can be measured at bit line 341. A pass voltage Vpass can be applied on unselected word lines to switch on unselected memory cells.

In some embodiments, a NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores 1 bit and has two logic states, logic {1 and 0}, i.e., states ER and S1 (state ER can also be referred to as S0). In the MLC mode, a memory cell stores 2 bits, and has four logic states, logic {11, 10, 01, and 00}, i.e., states ER, M1, M2, and M3 (state ER can also be referred to as M0). In the TLC mode, a memory cell stores 3 bits, and has eight logic states, logic {111, 110, 101, 100, 011, 010, 001, 000}, i.e., states ER, and states T1-T7 (state ER can also be referred to as T0). In the QLC mode, a memory cell stores 4 bits and has 16 logic states, logic {1111, 1110, 1101, 1100, 1011, 1010, 1001, 1000, 0111, 0110, 0101, 0100, 0011, 0010, 0001, 0000}, i.e., states ER, and states Q1-Q15 (state ER can also be referred to as Q0). Memory controller 20 of storage system 10 (see FIG. 1) can convert data received from host 15 into corresponding logic states of the memory cells on memory dies 100 and vice versa.

Figure 6:
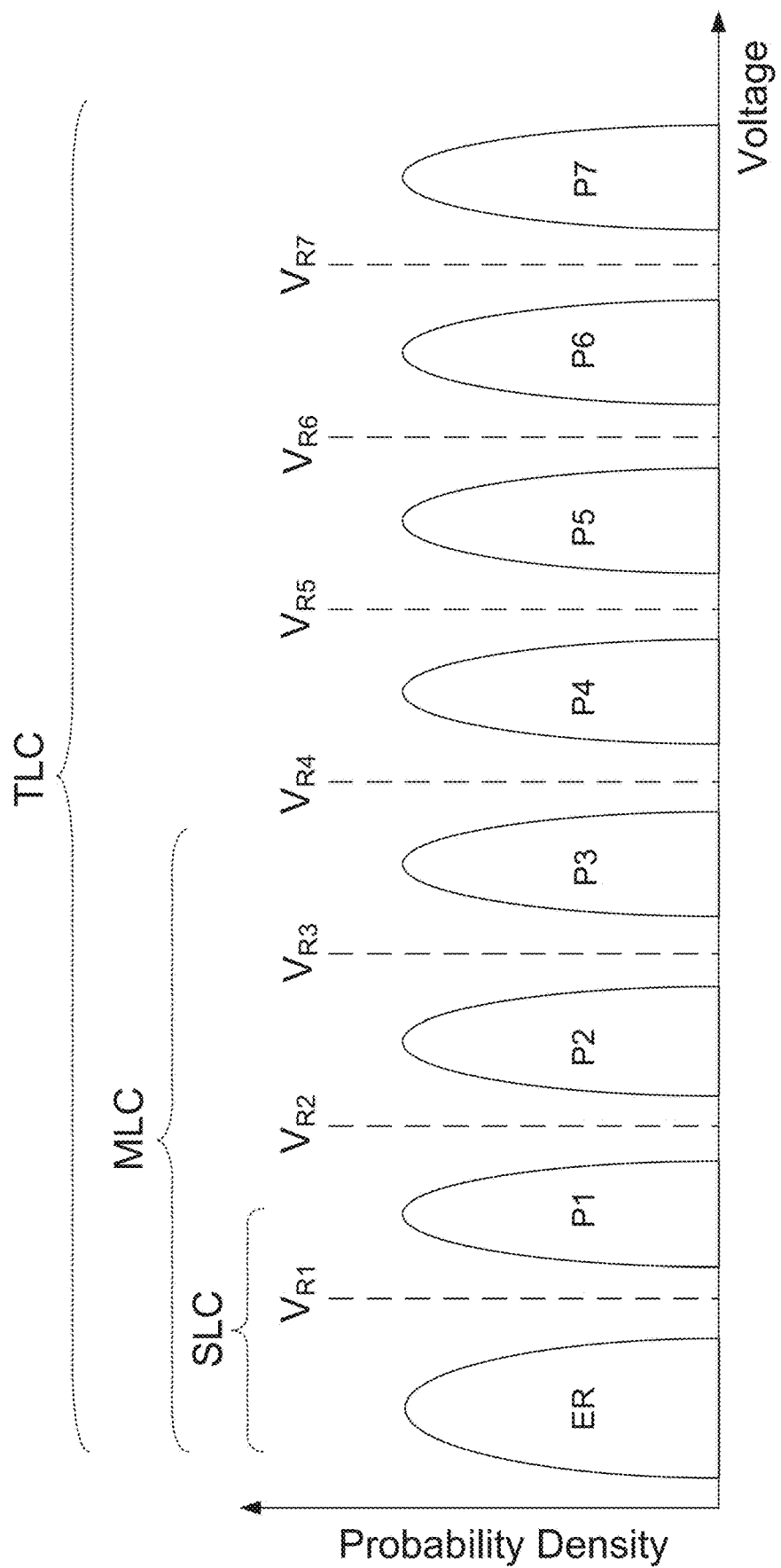
FIG. 6 illustrates a threshold voltage $V_{th}$ distribution of memory cells in a NAND flash memory, according to some embodiments.

FIG. 6 illustrates a threshold voltage $V_{th}$ distribution of a NAND flash memory programmed in the SLC, MLC, or TLC modes, according to some embodiments. In some embodiment of the SLC mode, state S1 may correspond to state P1. In some embodiment of the MLC mode, states M1-M3 may correspond to states P1-P3. In some embodiment of the TLC mode, states T1-T7 may correspond to states P1-P7. In some embodiments, each state of the memory cells can correspond to a specific range of threshold voltage $V_{th}$, where the threshold voltage $V_{th}$ distribution of each state can be represented by a probability density. In some embodiments, the states can be programmed by using an incremental step pulse programming (ISPP) scheme, in which the programming voltage provided to word lines included multiple voltage pulses, and an amplitude of each voltage pulse $V_{pgm}$ can be incrementally increased by adding a value $V_{step}$ to an amplitude of a previous voltage pulse. For example, the eight TLC states can be programmed from state ER corresponding to a lower threshold voltage to state T7 corresponding to a highest threshold voltage using the ISPP scheme.

In the ISPP scheme, a verification operation can be performed by page buffer 50, following each programming voltage $V_{pgm}$ provided to the word line. The verification operation checks whether the memory cell has been programmed into the state. In some embodiments, after each programming voltage $V_{pgm}$ is provided to the word line, the states ER and P1-P7 can be verified by using one or more read reference voltages $V_{R1}$-$V_{R7}$ during a verification operation. By applying one or more of the read reference voltages $V_{R1}$-$V_{R7}$ to the control gate of a target memory cell, the range of the memory cell's threshold voltage $V_{th}$ can be determined. For example, to verify if a memory cell is at state P1, the read reference voltage $V_{R1}$ can be used. If the target memory cell is at state ER, the threshold voltage $V_{th}$ of the target memory cell is lower than the read reference voltage $V_{R1}$. The target memory cell can be switch on and form a conductive path in the channel. If the target memory cell is programmed into the states P1, the threshold voltage $V_{th}$ of the target memory cell is higher than the read reference voltage $V_{R1}$. The target memory cell is thereby switched off. By measuring or sensing the current through the target memory cell at the corresponding bit line, via page buffer/sense amplifier 50, the threshold voltage $V_{th}$ or the state of the target memory cell can be verified. The programming process ends once the memory cell is verified to be programmed into P1.

To determine the two states ER and S1 stored in the SLC mode, it is sufficient to rely on just the read reference voltage $V_{R1}$. To determine the four states ER and M1-M3 in the MLC mode, the read reference voltages $V_{R1}$, $V_{R2}$ and $V_{R3}$ can be used. To determine the eight states ER and T1-T7 for the TLC mode, the read reference voltages $V_{R1}$-$V_{R7}$ can be used. For example, in the TLC mode, the threshold voltage of state ER is below $V_{R1}$, and the threshold voltage of state T7 is above $V_{R7}$, where the threshold voltages of state T1 is between $V_{R1}$ and $V_{R2}$. States T2-T6 can be determined similarly.

It is important to provide reliable programming operations on the memory cells, including reducing the probability that memory cells unselected (designated not to be programmed) during a programming process are programmed or interfered. Referring back to FIG. 5, in some embodiments, after programming a memory cell (for example, memory cell 340-1), there is a probability that the charge carriers injected into the memory film of the memory cell could escape back into a channel (for example, channel 338), decreasing the programmed threshold voltage $V_{th}$ of the memory cell. This phenomenon is called 'quick initial threshold-voltage shift (IVS)'. In some embodiments, IVS can shift and/or broaden the distribution of threshold voltage of a memory device. In some embodiments, the programming operation on a first memory cell (for example, memory cell 340-1) could affect the information stored on a second memory cell (for example, memory cell 340-2) adjacent to the first memory cell on the same string. This because an interference can happen when a programming voltage is provided to a first word line coupled to the first memory cell, but not to a second word line coupled to the second memory cell. The closer the two word lines, the stronger the interference can be. This interference can alter the condition of the charge carriers injected in the memory film of the first and second memory cells and shift their threshold voltages. Statistically, the distribution of the threshold voltage is broadened. This phenomenon is called 'WL interference' (or 'WL to WL interference', or 'coupling'). Both the IVS and the WL interference can significantly constrain the reliability of programming the memory cells.

Figure 7A:
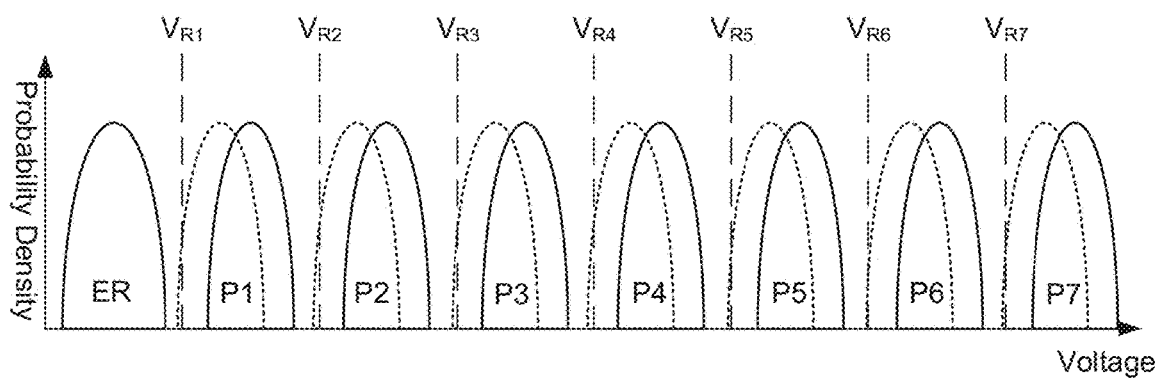
FIG. 7A illustrates an example of a threshold voltage $V_{th}$ distribution of memory cells in a NAND flash memory influenced by initial threshold voltage shift, according to some embodiments.
Figure 7B:
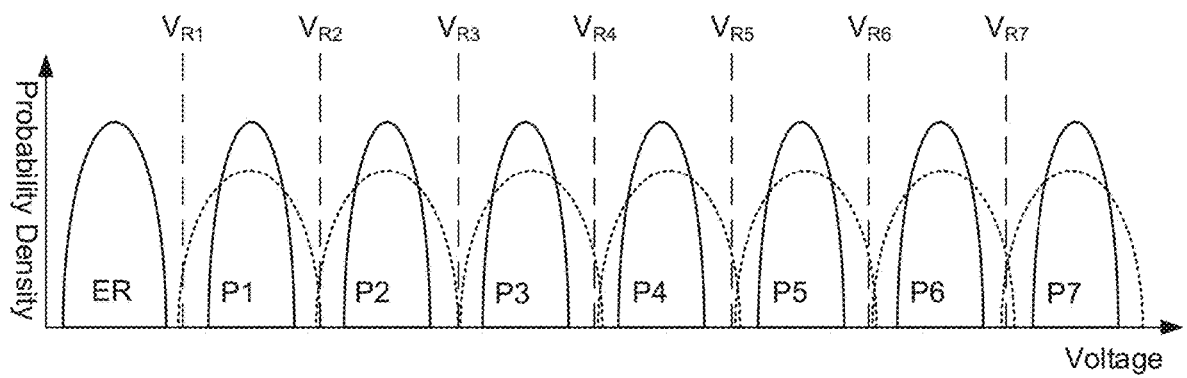
FIG. 7B illustrates an example of a threshold voltage $V_{th}$ distribution of memory cells in a NAND flash memory influenced by word line interference, according to some embodiments.

FIG. 7A illustrates an example of a statistical influence of IVS to the distribution of the threshold voltage $V_{th}$, according to some embodiments. Dashed curves shows a "shift" of the distribution of the threshold voltage $V_{th}$ to lower values, with respect to solid curves (which are the same as the solid curves in FIG. 6). In some embodiments, IVS can also cause the distribution of the threshold voltage $V_{th}$ to be broadened. In some embodiments, the shift is significant such that the distribution of the threshold voltage $V_{th}$ is no longer well separated by the read reference voltages $V_{R1}$-$V_{R7}$, causing programming errors. FIG. 7B illustrates the statistical influence of WL interference to the threshold voltage $V_{th}$ distribution, according to some embodiments. Dashed curves shows a "broadening" of the threshold voltage $V_{th}$ distribution, with respect to solid curves (which are the same as the solid curves in FIG. 6). In some embodiments, the broadening is significant such that the threshold voltage $V_{th}$ distribution is no longer well separated by the read reference voltages $V_{R1}$-$V_{R7}$, causing programming errors. In some embodiments, the problems caused by IVS and WL interference reduce the reliability of the programming operation and the performance of the memory device.

In order to mitigate issues as described above, a two-step programming method, including a first programming operation and a second programming operation on each memory cell, can be introduced. In the first programming operation, the memory cell is programmed from state ER into an intermediate state. In the second programming operation, the memory cell is further programmed from the intermediate state into a target state. In some embodiments, the threshold voltage corresponding to the intermediate state is within the range between the threshold voltages corresponding to the state ER and the target state. In some embodiments, the target state can be one of a plurality of target states, and the intermediate state can be one of a plurality of intermediate states, and the quantity of the intermediate states is less than the quantity of the target states. In some embodiments, the intermediate states and the target states follow some correspondence relations, in which each intermediate state corresponds to one or more target states.

Figure 8A:
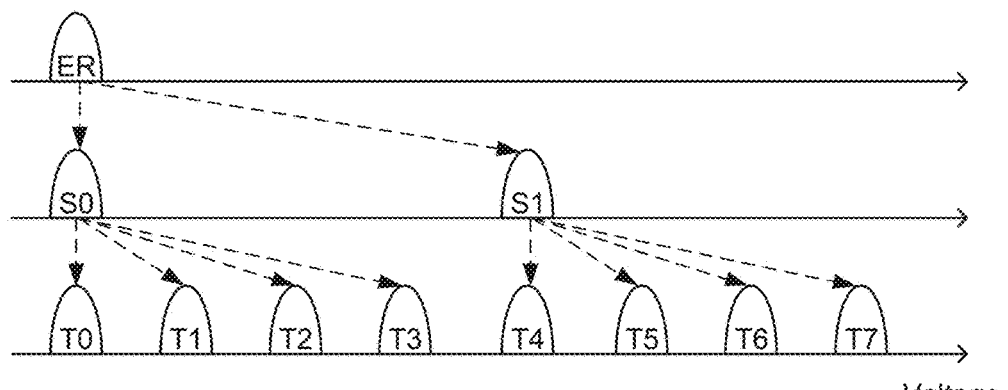
FIGS. 8A-8C illustrate examples of correspondence relation between intermediate states and target states in a two-step programming method, according to some embodiments.
Figure 8B:
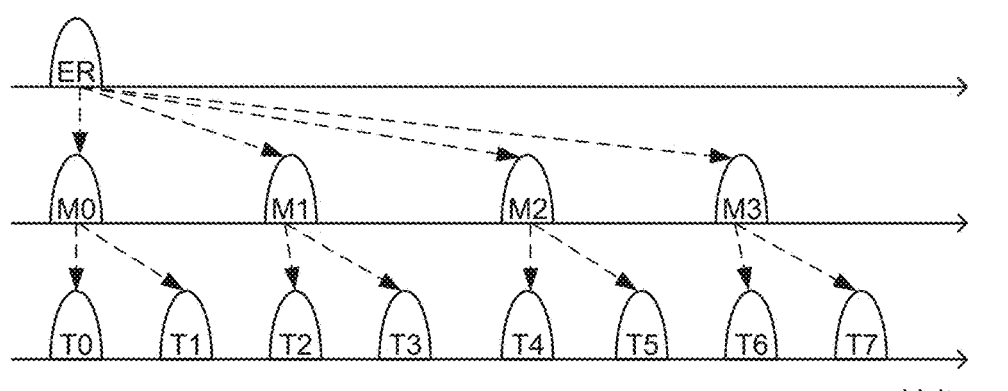
Figure 8C:
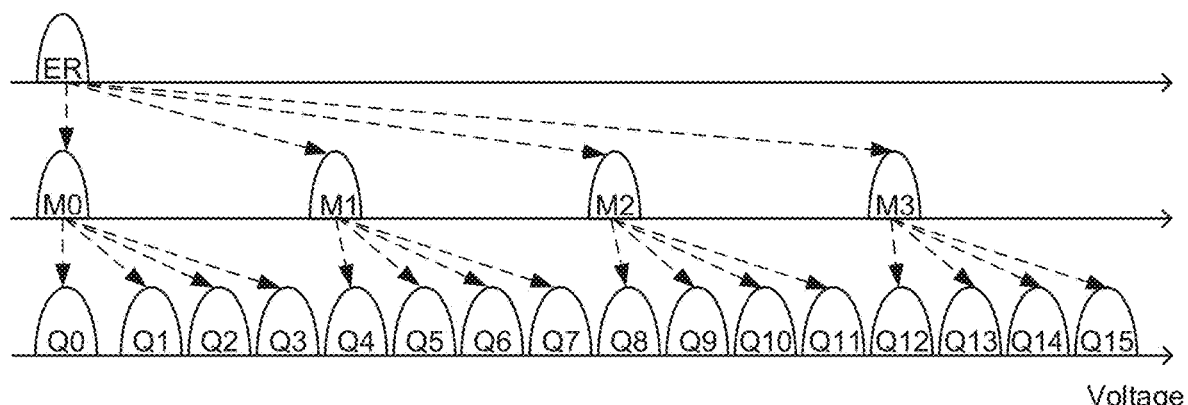

FIGS. 8A-8C illustrate examples of the correspondence relations between intermediate states and target states, according to some embodiments. In FIG. 8A, the intermediate states include two states S0 and S1, and the target states include eight states T0-T7. In this correspondence relation, S0 corresponds to T0-T3, and S1 corresponds to T5-T7. According to this correspondence relation, if the target state the memory cell to be programmed into is one of T0-T3, then by performing the first programming operation, the memory cell can be programmed from state ER into S0, and then by performing the second programming operation, the memory cell can be programmed from S0 into the target state. Similarly, if the target state the memory cell to be programmed into is one of T4-T7, then by performing the first programming operation, the memory cell can be programmed from state ER into S1, and then by performing the second programming operation, the memory cell can be programmed from S1 into the target state. Besides the example in FIG. 8A, it can be understood by persons of ordinary skill in the art that there are multiple options to configure the correspondence relation between the intermediate states and the target states, and program the memory cell using the two-step programming scheme according to the correspondence relation. For example, in some embodiments, S0 can correspond to T0-T2, and S1 can correspond to T3-T7. In some embodiments, S0 can correspond to T0 and T1, and S1 can correspond to T2-T7. In some embodiments, S0 can correspond to T0, and S1 can correspond to T1-T7. In some embodiments, S0 can correspond to T0-T4, and S1 can correspond to T5-T7. In some embodiments, S0 can correspond to T0-T5, and S1 can correspond to T6 and T7. In some embodiments, S0 can correspond to T0-T6, and S1 can correspond to T7.

FIG. 8B illustrates another example of correspondence relation between intermediate states and target states, in which the intermediate states include four states M0-M3, and the target states include eight states T0-T7. In this example, the correspondence relation between the intermediate states and the target states is: M0 corresponds to T0 and T1, M1 corresponds to T2 and T3, M2 corresponds to T4 and T5, and M3 corresponds to T6 and T7. FIG. 8C illustrates a third example of correspondence relation between intermediate states and target states, in which the intermediate states include four states M0-M3, and the target states include sixteen states Q0-Q15. In this example, the correspondence between the intermediate states and the target states is: M0 corresponds to Q0-Q3, M1 corresponds to Q4-Q7, M2 corresponds to Q8-Q11, and M3 corresponds to Q12-Q15. Similar to the discussion for FIG. 8A, other options of correspondence relation between the intermediate states and the target states, besides the examples shown in FIGS. 8B and 8C, would become obvious to persons of ordinary skill in the art based on the present disclosure.

In some embodiments, the two-step programming method can suppress IVS and WL interference. However, if both the first and second programming operations in the two-step programming method are performed using the ISPP scheme, the entire programming process to program a memory cell into a target state can be time-consuming and inefficient. In some embodiments, the programming time for the first programming operation can be reduced to improve the efficiency of the entire programming process. In some embodiment, performing the first programming operation can include providing a programming voltage to a word line coupled to the memory cell. In some embodiment, the programming voltage provided to the word line can include a single voltage pulse. In some embodiment, performing the first programming operation can omit a verification operation before performing the second programming operation. Compared with the ISPP scheme, in which multiple voltage pulses with incrementally increasing amplitude are provided to the word line, and a verification operation is performed after voltage pulse is provided to the word line, the efficiency of the first programming operation can be improved by providing a single pulse to the word line and omitting the verification operation.

In some embodiments, after performing the first programming operation, a threshold voltage of the memory cell is influenced by an amplitude of the single voltage pulse provided to the word line. In some embodiments, a memory cell can be under-programmed, if the amplitude of the single voltage pulse is too low, resulting in a low threshold voltage. When under-programming happens, the suppression of IVS and WL interference may not be effective. In some embodiments, the memory cell can be over-programmed, if the amplitude of the single voltage pulse is too high, resulting in a high threshold voltage of the memory cell at the intermediate state, which can be even higher than when the memory cell is in the target state. In some embodiments, when over-programming happens, the threshold voltage of the memory cell at the intermediate state can be so high that after the second programming operation, it may surpass a threshold voltage if the memory cell is at the target state. When over-programming happens, the programming operation fails, and the reliability of the programming process is reduced.

Figure 9:
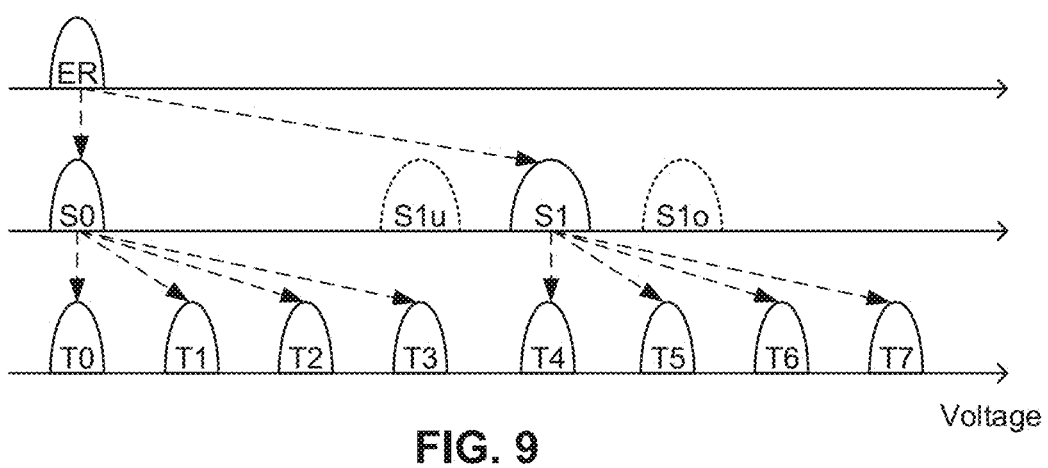
FIG. 9 illustrates examples of a threshold voltage $V_{th}$ distribution of memory cells in a NAND flash memory, when an intermediate state is under-programmed, correctly programmed, and over-programmed, in a first programming operation of a two-step programming method, according to some embodiments.

FIG. 9 illustrates examples of threshold voltage distribution of an intermediate state under three cases with three different amplitudes of the singe voltage pulse provided to the word line in the first programming operation. In FIG. 9, a correspondence relation between intermediate states and target states is the same as discussed in FIG. 8A. In a first case, the amplitude of the single voltage pulse is low, the threshold voltage of the memory cell is within a distribution of S1u, and the memory cell is under-programmed after the first programming operation. In a second case, the amplitude of the single voltage pulse is medium, the threshold voltage of the memory cell is within a distribution of S1, the memory cell can be correctly-programmed after the first programming operation. In a third case, the amplitude of the single voltage pulse is high, the threshold voltage of the memory cell is within a distribution of S1o, and the memory cell can be over-programmed after the first programming operation.

In order to solve the issues of under-programming and over-programming, the first programming operation can include providing a single voltage pulse with a sufficiently high amplitude to the word line to avoid under-programming, while providing a bias voltage to a bit line coupled to the memory cell as a voltage compensation to avoid over-programming.

Figure 10A:
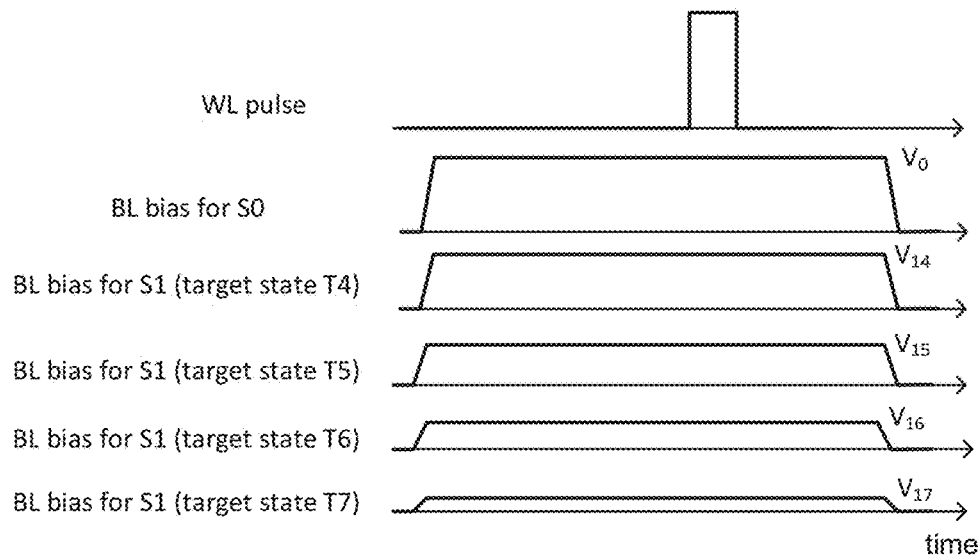
FIG. 10A-10C illustrate examples of performing a first programming operation in a two-step programming method by providing a bias voltage to a bit line coupled to a memory cell and providing a programming voltage to a word line coupled to the memory cell, according to some embodiments.
Figure 10B:
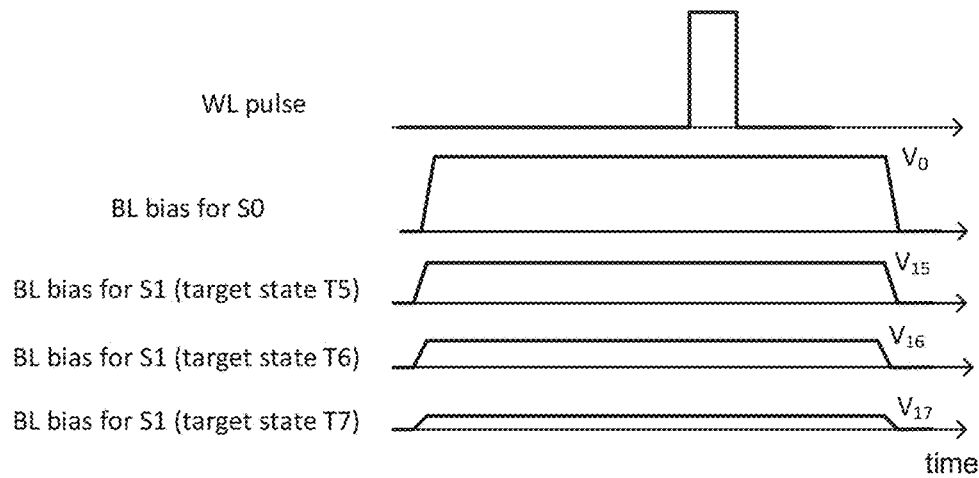
Figure 10C:
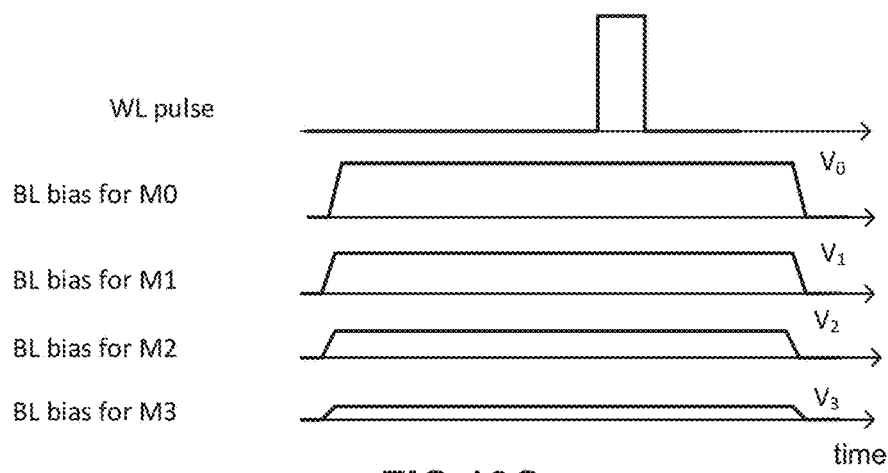

FIG. 10A-10C illustrate exemplary schemes of performing the first programming operation to program a memory cell into an intermediate state, by providing a bias voltage on a bit line coupled to the memory cell and providing a programming voltage to a word line coupled to the memory cell, according to some embodiments. In some embodiments, the programming voltage can be provided to the word line while the bias voltage is provided to the bit line. In some embodiments, the programming voltage can comprise a single voltage pulse to improve the programming efficiency. In some embodiments, an amplitude of the programming voltage can be high enough to avoid under-programming. In some embodiments, providing the bias voltage to the bit line can compensate the high amplitude of the programming voltage to avoid over-programming. In some embodiments, after providing the programming voltage to the word line, and before performing an upcoming second programming operation on the memory cell to program it into a target state, a verification operation on the memory cell can be omitted, which improves the programming efficiency.

In FIG. 10A, the intermediate state can be one of two intermediate states S0 and S1, and the target state can be one of eight target states T0-T7. A correspondence relation between the intermediate states and the target states is: S0 corresponds to T0-T3, and S1 corresponds to T4-T7, the same as the correspondence relation in FIG. 8A. FIG. 10A illustrates that an amplitude of the bias voltage applied on the bit line depends on the intermediate state and the target state that the memory cell is to be programmed into. If the target state is one of T0-T3, the intermediate state is S0 according to the correspondence relation, and the amplitude of the bias voltage provided on the bit line can have as a value of $V_0$. The value $V_0$ can be high enough (for example, as high as $V_{inhibit}$) such that the memory cell is inhibit to be programmed by the programming voltage provided to the word line, and the memory cell stays in S0. If the target state is T4, the amplitude of the bias voltage provided on the bit line can have a value of $V_{14}$ smaller than $V_0$, so that the programming voltage provided on the word line can program the memory cell into the intermediate state S1. If the target state is T5, the amplitude of the bias voltage provided on the bit line can have a value of Vis equal to or smaller than $V_{14}$, so that the programming voltage provided on the word line can have a higher efficiency to program the memory cell into S1, with the threshold voltage of the memory cell equal or higher than it is as if the amplitude of the bias voltage is $V_{14}$, and the upcoming second programming operation can have a higher efficiency to program the memory cell from S1 to T5. If the target state is T6, the amplitude of the bias voltage provided on the bit line can have a value of $V_{16}$ equal to or smaller than $V_{15}$, so that the programming voltage provided on the word line can have a higher efficiency to program the memory cell into S1, with the threshold voltage of the memory cell equal or higher than it is as if the amplitude of the bias voltage is $V_{15}$, and the upcoming second programming operation can have a higher efficiency to program the memory cell from S1 to T6. If the target state is T7, the amplitude of the bias voltage provided on the bit line can have a value of $V_{17}$ equal to or smaller than $V_{16}$, so that the programming voltage provided on the word line can have a higher efficiency to program the memory cell into S1, with the threshold voltage of the memory cell equal or higher than it is as if the amplitude of the bias voltage is $V_{16}$, and the upcoming second programming operation can have a higher efficiency to program the memory cell from S1 to T7. FIG. 10A shows that, in some embodiments, the relation between different values of the amplitude of the bias voltage can be $V_0 > V_{14} \geq V_{15} \geq V_{16} \geq V_{17}$. Under such a relation, after the first programming operation, a threshold voltage of the memory cell at the intermediate state S1 can be closer to the threshold voltage of the memory cell at the target state while over-programming can be avoided, and the efficiency of the upcoming second programming operation can be improved.

FIG. 10B illustrates another exemplary scheme of performing the first programming operation to program a memory cell into an intermediate state, according to some embodiments. In FIG. 10B, the intermediate state can be one of two intermediate states S0 and S1, and the target state can be one of eight target states T0-T7. A corresponding relation between the intermediate states and the target states is: S0 corresponds to T0-T4, and S1 corresponds to T5-T7. FIG. 10B illustrates that an amplitude of the bias voltage applied on the bit line depends on the intermediate state and the target state which the memory cell is to be programmed into. If the target state is one of T0-T4, the intermediate state is S0, and the amplitude of the bias voltage provided on the bit line can have as a value of $V_0$. The value $V_0$ can be high enough (for example, as high as $V_{inhibit}$) such that the memory cell is inhibit from the programming voltage provided to the word line, and the memory cell stays in S0. If the target state is T5, the amplitude of the bias voltage provided on the bit line can have a value of $V_{15}$ smaller than $V_0$. If the target state is T6, the amplitude of the bias voltage provided on the bit line can have a value of $V_{16}$ equal to or smaller than $V_{15}$. If the target state is T7, the amplitude of the bias voltage provided on the bit line can have a value of $V_{17}$ equal to or smaller than $V_{16}$. FIG. 10B shows that, in some embodiments, the relation between different values of the amplitude of the bias voltage can be $V_0 > V_{15} \geq V_{16} \geq V_{17}$. Under such a relation, after the first programming operation, a threshold voltage of the memory cell at the intermediate state S1 can be closer to the threshold voltage of the memory cell at the target state while over-programming can be avoided, and the efficiency of the upcoming second programming operation can be improved.

FIG. 10C illustrates a third exemplary scheme of performing the first programming operation to program a memory cell into an intermediate state, according to some embodiments. In FIG. 10C, the intermediate state can be one of four intermediate states M0-M3. There can be different correspondence relations between the intermediate states and the target states. For example, if the total number of target states is eight, then each intermediate state can correspond to two target states, the same as the correspondence relation in FIG. 8B. If the total number of target states is sixteen, then each intermediate state can correspond to four target states, the same as the correspondence relation in FIG. 8C. FIG. 10C illustrates that an amplitude of the bias voltage applied on the bit line depends on the intermediate state which the memory cell is to be programmed into. If the intermediate state is M0, the amplitude of the bias voltage provided on the bit line can have a value of $V_0$. The value $V_0$ can be high enough (for example, as high as $V_{inhibit}$) such that the memory cell is inhibit from the programming voltage provided to the word line, and the memory cell stays in M0. If the intermediate state is M1, the amplitude of the bias voltage provided on the bit line can have a value of $V_1$. If the intermediate state is M2, the amplitude of the bias voltage provided on the bit line can have a value of $V_2$. If the intermediate state is M3, the amplitude of the bias voltage provided on the bit line can have a value of $V_3$. FIG. 10C shows that, in some embodiments, the relation between different values of the amplitude of the bias voltage can be $V_0 > V_1 > V_2 > V_3$. Under such a relation, after the first programming operation, a threshold voltage of the memory cell at the intermediate state can be closer to the threshold voltage of the memory cell at a target state corresponding to the intermediate state, and the efficiency of the upcoming second programming operation can be improved. It should be understood that FIGS. 10A-10C and are for illustrative purposes only. A person skilled in the pertinent art will recognize that other relations between different amplitudes of bias voltage provided to the bit line can be used, and other correspondence relations between the intermediate states and the target states can be used, without departing from the spirit and scope of the present disclosure.

Figure 11:
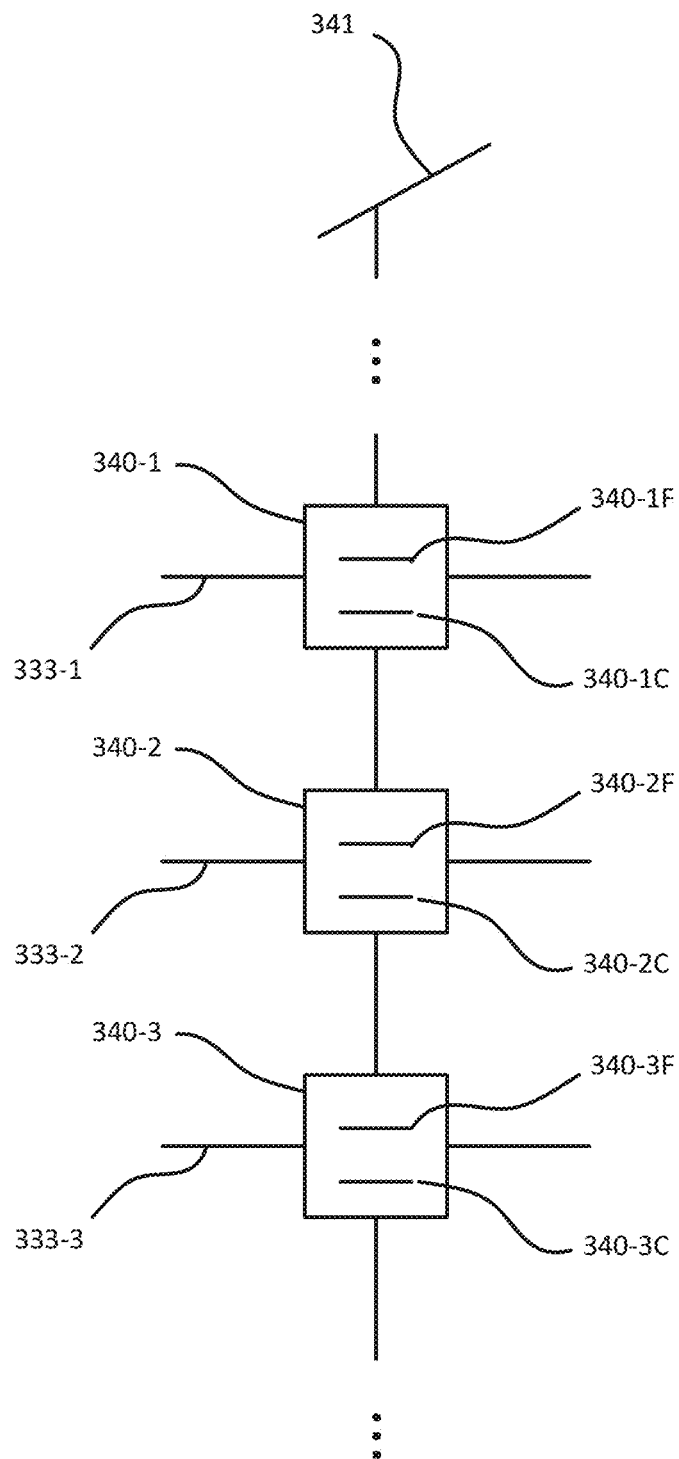
FIG. 11 illustrates the implementation of the two-step programming method on neighboring cells on a same string in a 3D NAND flash memory, according to some embodiments.

The two-step programming method on one memory cell can be extended to program multiple memory cells coupled to a same bit line. FIG. 11 illustrates examples of implementing the two-step programming method on three adjacent memory cells 340-1, 340-2, and 340-3 among a plurality of memory cells coupled to a bit line 341. Memory cells 340-1, 340-2, and 340-3 are coupled to three adjacent word lines 333-1, 333-2, and 333-3, respectively. For each of the memory cells, first and second horizontal lines represent first and second programming operations. For example, 340-1C represents a first programming operation that programs memory cell 340-1 from an erased state into an intermediate state, and 340-1F represents a second programming operation that programs memory cell 340-1 from the intermediate state into a target state. The programming operations of 340-2C, 340-2F, 340-3C, and 340-3F are similar. In some embodiments, an order of programming operations performed on multiple memory cells by combining the two programming operations on each of the memory cells follows a general rule, in which the second programming operation on each of the memory cells can be executed after the first programming operations on one or two adjacent memory cells are finished. For example, the second programming operation 340-2F of the memory cell 340-2 is performed after the first programming operation 340-1C of the memory cell 340-1 and the first programming operation 340-3C of the memory cell 340-3 are finished. In another example, the second programming operation 340-1F of the memory cell 340-1 is performed after the first programming operation 340-2C of the memory cell 340-2 is finished. Based on the general rule, the order of the first and second programming operations on the memory cells 340-1, 340-2, and 340-3 can be 340-3C→340-2C→340-1C→340-3F→340-2F→340-1F, according to an embodiment. In another embodiment, the order of the programming operations can be 340-3C→340-2C→340-3F→340-1C→340-2F→340-1F. There can be other schemes to arrange the order of the first and second programming operations on the memory cells 340-1, 340-2, and 340-3, according to the general rule, as would become obvious to persons of ordinary skill in the art based on the present disclosure.

Figure 12:
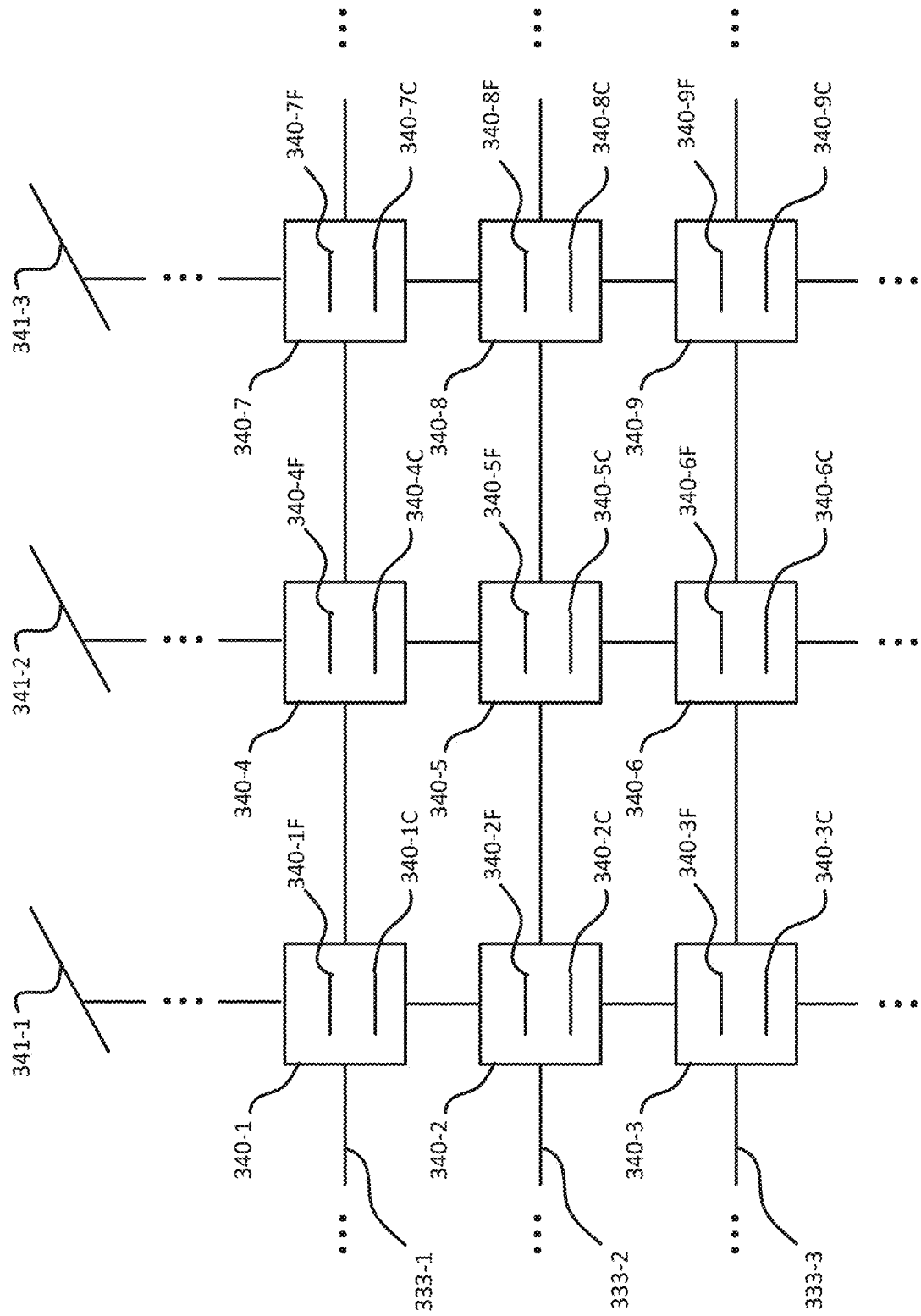
FIG. 12 illustrates the implementation of the two-step programming method on an array comprising multiple memory cells involving multiple word lines and multiple bit lines in a 3D NAND flash memory, according to some embodiments.

The two-step programming method on one memory cell can be extended to program multiple memory cells involving multiple bit lines and multiple word lines. FIG. 12 illustrates examples of implementing the two-step programming method on an array of memory cells in a memory device. The memory cells of the array are denoted by 340-1 to 340-9, wherein memory cells 340-1, 340-2, and 340-3 are adjacent memory cells coupled to a bit line 341-1, memory cells 340-4, 340-5, and 340-6 are adjacent memory cells coupled to a bit line 341-2, memory cells 340-7, 340-8, and 340-9 are adjacent memory cells coupled to a bit line 341-3. Memory cells 340-1, 340-4, and 340-7 are coupled to a word line 333-1. Memory cells 340-2, 340-5, and 340-8 are coupled to a word line 333-2. Memory cells 340-3, 340-6, and 340-9 are coupled to a word line 333-3. Word lines 333-1 and 333-3 are adjacent to word line 333-2. In some embodiments, the memory cells, word lines, and bit lines can be the same as they are in FIG. 5. In each of the memory cells, two horizontal lines represent two programming operations, similar to the discussion in FIG. 11. For example, 340-1C is a first programming operation that programs memory cell 340-1 from an erased state into an intermediate state, and 340-1F is a second programming operation that programs memory cell 340-1 from the intermediate state into a target state.

Similar to the discussion in FIG. 11, in some embodiments, an order of programming multiple memory cells by combining the two-step programming method on each of the memory cells follows a general rule, in which the second programming operation on each of the memory cells can be executed after the first programming operations on adjacent memory cells are finished. There are more than one way of arranging the order of the programming operations on the 3×3 array of memory cells in FIG. 12, according to the general rule. In some embodiments, the order of the programming operations is in accordance with a following programming scheme. First, the memory cells coupled to first and second adjacent word lines (for example, word lines 333-3 and 333-2) can be programmed into intermediate states. After that, the memory cells coupled to the first word line (for example, word line 333-3) can be programmed into target states. Thirdly, the memory cells coupled to a third word line adjacent to the second word line (for example, word line 333-1) can be programmed into intermediate states. This process can be repeated to memory cells coupled to further word lines following the third word line, as would be obvious to persons of ordinary skill in the art based on the present disclosure. In an example, the order of the programming operations can be 340-3C→340-6C→340-9C→340-2C→340-5C→340-8C→340-3F→340-6F→340-9F→340-1C→340-4C→340-7C→340-2F→340-5F→340-8F.

In some embodiments, the order of the programming operations is in accordance with another programming scheme described in the following. First, two memory cells (for example, memory cells 340-3 and 340-2) coupled to first and second adjacent word lines (for example, word lines 333-3 and 333-2) and a first bit line (for example, bit line 341-1) can be programmed into intermediate states. After that, one of the two memory cells (for example, memory cell 340-3) can be programmed into a target state. Thirdly, another two memory cells (for example, memory cells 340-6 and 340-5) coupled to the first and second adjacent word lines and a second bit line (for example, bit line 341-2) can be programmed into intermediate states. This process can be repeated to memory cells coupled to further word lines following the second word line and further bit lines, as would be obvious to persons of ordinary skill in the art based on the present disclosure. In an example, the order could be 340-3C→340-2C→340-3F→340-6C→340-5C→340-6F→340-9C→340-8C→340-9F→340-1C→340-2F→340-4C→340-5F→340-7C→340-8F.

It is clear to those skilled in the art that similar programming scheme based on the general rule can be implemented on a plurality of memory cells in multiple arrays of memory cells, wherein the arrays of memory cells may have different sizes, and may have regular and/or irregular shapes. The order of programming operations, which involves accessing the selected word lines and bit lines of the memory device by word line driver 40 and bit line driver 52 in FIG. 4, respectively, can by selected according to the instructions stored in or received by Control Circuit 70.

In summary, the present disclosure provides a method for programming a memory device using a two-step programming scheme, involving a first programming operation that programs a memory cell into an intermediate state among a plurality of intermediate states, and a second programming operation that programs the memory cell into a target state among a plurality of target states, according to the data to be stored. Each of the intermediate states corresponds to at least one target state. In some embodiments, the second programming operation can be implemented according to the ISPP scheme, while the first programming operation can be implemented by a scheme different from the ISPP scheme to improve the programming efficiency. In some embodiments, the first programming operation comprises providing a bias voltage to a bit line coupled to the memory cell and providing a programming voltage to a word line coupled to the memory cell. In some embodiments, the programming voltage provided to the word line can include a single programming pulse. In some embodiments, the bias voltage provided to the bit line can have an amplitude selected in accordance with a reference voltage of the memory cell in the target state or the intermediate state. In some embodiments, the larger the reference voltage, the lower the amplitude of the bias voltage provided to the bit line. In some embodiments, a verification operations between the first and second programming operation can be omitted.

In some embodiments, a quantity of the plurality of intermediate states is two, another quantity of the plurality of target states is eight, and each of the plurality of intermediate states corresponds to four target states among the plurality of target states. In some embodiments, the quantity of the plurality of intermediate states is four, the another quantity of the plurality of target states is eight, and each of the plurality of intermediate states corresponds to two target states among the plurality of target states. In some embodiments, the quantity of the plurality of intermediate states is four, the another quantity of the plurality of target states is sixteen, and each of the plurality of intermediate states corresponds to four target states among the plurality of target states. In some embodiments, the two-step programming method can be generalized to program multiple memory cells in arrays. In some embodiments, the method can be generalized to apply the two-step programming scheme to program the memory cell and another memory cell couple to the bit line and another word line adjacent to the word line, with the another memory cell to be programmed into another target state among the plurality of target states. The method can further include performing a third programming operation to program the another memory cell from the erased state into another intermediate state among the plurality of intermediate states, and performing a fourth programming operation to program the another memory cell from the another intermediate state into the another target state. The third programming operation is performed before the second programming method. The fourth programming operation is performed after the first programming method.

In some embodiments, a memory device can implement the two-step programming scheme for date storage. The memory device can include a memory array comprising a memory cell, a bit line coupled to the memory cell, and a word line coupled to the memory cell. The memory device can further include a peripheral circuit to program the memory cell. The peripheral circuit can include a page buffer coupled to the bit line and a word line driver coupled to the word line. The peripheral circuit is configured to execute the two-step programming scheme, by performing a first programming operation to program the memory cell from an erased state into an intermediate state among a plurality of intermediate states, and by performing a second programming operation to program the memory cell from the intermediate state into a target state among a plurality of target states. Each of the intermediate states corresponds to at least one target state. In some embodiments, the peripheral circuit performs the first programming operation by providing a bias voltage to the bit line from the page buffer, and by providing a programming voltage to the word line from the word line driver. In some embodiments, the programming voltage provided to the word line can include a single programming pulse. In some embodiments, the bias voltage provided to the bit line can have an amplitude selected in accordance with a reference voltage of the memory cell in the target state or the intermediate state. In some embodiments, the larger the reference voltage, the lower the amplitude of the bias voltage provided to the bit line. In some embodiments, the peripheral circuit can omit a verification operations between the first and second programming operations.

In some embodiments, the memory array can include another memory cell couple to the bit line and another word line adjacent to the word line, and the peripheral circuit can further be configured to implement the two-step programming method to program the another memory cell into another target state among the plurality of target states. The peripheral circuit can further be configured to perform a third programming operation to program the another memory cell from the erased state into another intermediate state among the plurality of intermediate states, and perform a fourth programming operation to program the another memory cell from the another intermediate state into the another target state. The third programming operation is performed before the second programming method. The fourth programming operation is performed after the first programming method.

In some embodiments, a memory system can implement the two-step programming scheme for date storage. The memory system can include a memory controller configured to provide programming commands and a memory device coupled to the memory controller and configured to receive the programming commands. The memory device can include a memory array comprising a memory cell, a bit line coupled to the memory cell, and a word line coupled to the memory cell. The memory device can further include a peripheral circuit to program the memory cell. The peripheral circuit can include a page buffer coupled to the bit line and a word line driver coupled to the word line. The peripheral circuit is configured to execute the two-step programming scheme according to the programming commands, by performing a first programming operation to program the memory cell from an erased state into an intermediate state among a plurality of intermediate states, and by performing a second programming operation to program the memory cell from the intermediate state into a target state among a plurality of target states. Each of the intermediate states corresponds to at least one target state. In some embodiments, the peripheral circuit performs the first programming operation by providing a bias voltage to the bit line from the page buffer, and by providing a programming voltage to the word line from the word line driver. In some embodiments, the programming voltage provided to the word line can include a single programming pulse. In some embodiments, the bias voltage provided to the bit line can have an amplitude selected in accordance with a reference voltage of the memory cell in the target state or the intermediate state. In some embodiments, the larger the reference voltage, the lower the amplitude of the bias voltage provided to the bit line. In some embodiments, the peripheral circuit can omit a verification operations between the first and second programming operations.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for programming a memory device, wherein the memory device comprises a memory cell to be programmed into a target state among a plurality of target states, the method comprising:
    performing a first programming operation to program the memory cell into an intermediate state, wherein the intermediate state is among a plurality of intermediate states, each of the plurality of intermediate states corresponding to at least one of the plurality of target states, the first programming operation comprising:
    providing a bias voltage to a bit line coupled to the memory cell, wherein the bias voltage has an amplitude corresponding to the target state; and
    providing a programming voltage to a word line coupled to the memory cell.

2. The method of claim 1, further comprising performing, after the first programming operation, a second programming operation to program the memory cell into the target state.

3. The method of claim 1, wherein providing the programming voltage comprises providing a single voltage pulse.

4. The method of claim 2, wherein after providing the programming voltage to the word line and before performing the second programming operation, no verification operation is performed on the memory cell.

5. The method of claim 2, wherein performing the second programming operation comprises performing an incremental step pulse programming (ISPP) operation.

6. The method of claim 1, wherein:
the plurality of target states comprises first and second target states corresponding to first and second threshold voltages of the memory cell, respectively, wherein the second threshold voltage is greater than the first threshold voltage; and
the first and second target states correspond to first and second amplitudes of the bias voltage, respectively, wherein the second amplitude is not greater than the first amplitude.

7. The method of claim 1, wherein:
the plurality of intermediate states comprises first and second intermediate states corresponding to first and second threshold voltages of the memory cell, respectively, wherein the second threshold voltage is greater than the first threshold voltage; and
the first and second intermediate states correspond to first and second amplitudes of the bias voltage, respectively, wherein the second amplitude is less than the first amplitude.

8. The method of claim 2, wherein the memory device further comprises another memory cell to be programmed into the target state or another target state among the plurality of target states, wherein the another memory cell is coupled to the bit line and another word line adjacent to the word line, the method further comprising:
performing, before performing the second programming operation, a third programming operation to program the another memory cell into the intermediate state or another intermediate state among the plurality of intermediate states, wherein the another intermediate state corresponds to the another target state, the third programming operation comprising:
providing the bias voltage to the bit line, wherein the bias voltage has the amplitude or another amplitude corresponding to the another target state; and
providing the programming voltage to the another word line; and
performing, after performing the first and the third programming operations, a fourth programming operation to program the another memory cell from the intermediate state into the target state or from the another intermediate state into the another target state.

9. A memory device, comprising:
a memory array, comprising:
a memory cell to be programmed into a target state among a plurality of target states;
a word line coupled to the memory cell; and
a bit line coupled to the memory cell; and
a peripheral circuit coupled to the bit line and the word line, the peripheral circuit configured to:
perform a first programming operation to program the memory cell into an intermediate state among a plurality of intermediate states, wherein:
the intermediate state corresponds to the target state;
each of the plurality of intermediate states corresponds to at least one of the plurality of target states; and
the first programming operation comprises:
providing a bias voltage to the bit line, wherein the bias voltage has an amplitude corresponding to the target state; and
providing a programming voltage to the word line.

10. The memory device of claim 9, wherein the peripheral circuit is further configured to perform a second programming operation to program the memory cell from the intermediate state into the target state.

11. The memory device of claim 9, wherein the programming voltage comprises a single voltage pulse.

12. The memory device of claim 10, wherein between the first and second programming operations, the peripheral circuit is further configured not to perform a verification operation on the memory cell.

13. The memory device of claim 9, wherein:
the plurality of target states comprises first and second target states corresponding to first and second threshold voltages of the memory cell, respectively, wherein the second threshold voltage is greater than the first threshold voltage; and
the first and second target states correspond to first and second amplitudes of the bias voltage, respectively, wherein the second amplitude is not greater than the first amplitude.

14. The memory device of claim 9, wherein:
the plurality of intermediate states comprises first and second intermediate states corresponding to first and second threshold voltages of the memory cell, respectively, wherein the second threshold voltage is greater than the first threshold voltage; and
the first and second intermediate states correspond to first and second amplitudes of the bias voltage, respectively, wherein the second amplitude is less than the first amplitude.

15. The memory device of claim 10, wherein:
the memory device further comprises another memory cell to be programmed into another target state among the plurality of target states, wherein the another memory cell is coupled to the bit line and another word line adjacent to the word line; and
the peripheral circuit is further configured to:
perform, before the second programming operation, a third programming operation to program the another memory cell into another intermediate state among the plurality of intermediate states, wherein the another intermediate state corresponds to the another target state, and wherein the third programming operation comprises:
providing, by a bit line driver, the bias voltage to the bit line, wherein the bias voltage has another amplitude corresponding to the another target state; and
providing, by a word line driver, the programming voltage to the another word line; and
perform, after performing the first and third programming operations, a fourth programming operation to program the another memory cell from the another intermediate state into the another target state.

16. A memory system, comprising:
a memory controller configured to provide programming commands; and
a memory device coupled to the memory controller and configured to receive the programming commands, wherein the memory device comprises:
a memory array, comprising:
a memory cell to be programmed into a target state among a plurality of target states;
a bit line coupled to the memory cell; and
a word line coupled to the memory cell; and
a peripheral circuit comprising a bit line driver coupled to the bit line and a word line driver coupled to the word line, wherein the peripheral circuit is configured to execute the programming commands, comprising:

performing a first programming operation to program the memory cell into an intermediate state among a plurality of intermediate states, wherein:
the intermediate state corresponds to the target state;
each of the plurality of intermediate states corresponds to at least one of the plurality of target states; and
the first programming operation comprises:
providing, by the bit line driver, a bias voltage to the bit line, wherein the bias voltage has an amplitude corresponding to the target state; and
providing, by the word line driver, a programming voltage to the word line.

17. The memory system of claim 16, wherein the programming commands further comprises performing a second programming operation to program the memory cell from the intermediate state into the target state.

18. The memory system of claim 16, wherein the programming voltage comprises a single voltage pulse.

19. The memory system of claim 16, wherein:
the plurality of target states comprises first and second target states corresponding to first and second threshold voltages of the memory cell, respectively, wherein the second threshold voltage is greater than the first threshold voltage; and
the first and second target states correspond to first and second amplitudes of the bias voltage, respectively, wherein the second amplitude is not greater than the first amplitude.

20. The memory system of claim 17, wherein the peripheral circuit is further configured not to perform a verification operation on the memory cell between the first and second programming operations.

\* \* \* \* \*